(12) United States Patent
Bardsley et al.

(10) Patent No.: US 7,091,891 B2
(45) Date of Patent: Aug. 15, 2006

(54) CALIBRATION OF ANALOG TO DIGITAL CONVERTER BY MEANS OF MULTIPLEXED STAGES

(75) Inventors: Scott G. Bardsley, Summerfield, NC (US); Baeton C. Rigsbee, High Point, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/833,774

(22) Filed: Apr. 28, 2004

(65) Prior Publication Data

US 2005/0242977 A1   Nov. 3, 2005

(51) Int. Cl.
*H03M 1/10* (2006.01)
*H03M 1/38* (2006.01)
*G01R 35/00* (2006.01)
*G06F 19/00* (2006.01)

(52) U.S. Cl. .................. 341/120; 341/161; 702/107
(58) Field of Classification Search ............. 341/120, 341/118, 155, 161, 141, 122, 139, 150, 158; 702/106, 107; 327/94; 455/276.1, 232.1; 324/765

See application file for complete search history.

(56) References Cited

U.S. PATENT DOCUMENTS

| | | | | |
|---|---|---|---|---|
| 4,973,976 A * | 11/1990 | Lee et al. | ............ | 341/141 |
| 5,047,769 A * | 9/1991 | Engeler et al. | ............ | 341/118 |
| 5,214,430 A * | 5/1993 | Gulczynski | ............ | 341/120 |
| 5,635,937 A * | 6/1997 | Lim et al. | ............ | 341/161 |
| 5,784,016 A | 7/1998 | Nagaraj | ............ | 341/120 |
| 5,977,894 A * | 11/1999 | McCarroll et al. | ............ | 341/120 |
| 6,031,478 A * | 2/2000 | Oberhammer et al. | ............ | 341/155 |
| 6,121,908 A | 9/2000 | Sevastopoulos et al. | ............ | 341/139 |
| 6,169,502 B1 * | 1/2001 | Johnson et al. | ............ | 341/120 |
| 6,198,314 B1 | 3/2001 | Kase | ............ | 307/94 |
| 6,198,420 B1 | 3/2001 | Ryan et al. | ............ | 341/155 |
| 6,252,536 B1 * | 6/2001 | Johnson et al. | ............ | 341/155 |
| 6,259,392 B1 | 7/2001 | Choi et al. | ............ | 341/150 |
| 6,304,205 B1 * | 10/2001 | Rezvani et al. | ............ | 341/161 |
| 6,310,571 B1 * | 10/2001 | Yang et al. | ............ | 341/155 |
| 6,323,800 B1 | 11/2001 | Chiang | ............ | 341/161 |
| 6,340,944 B1 * | 1/2002 | Chang et al. | ............ | 341/161 |
| 6,384,757 B1 * | 5/2002 | Kosonen | ............ | 341/120 |
| 6,384,758 B1 | 5/2002 | Michalski et al. | ............ | 341/122 |
| 6,459,394 B1 | 10/2002 | Nadi et al. | ............ | 341/120 |

(Continued)

OTHER PUBLICATIONS

Analog Devices, "10-Bit, 40 MSPS, 3 V, 74 mW A/D Converter," AD9203, 2001, pp. 1-24, no month.

(Continued)

Primary Examiner—Patrick Wamsley
(74) Attorney, Agent, or Firm—Wolf, Greenfield & Sacks, P.C.

(57) ABSTRACT

An improved pipelined analog to digital converter that facilitates calibration for non-linearity errors and a method for obtaining calibration values. The analog to digital converter has a calibration mode in which the output bits for stages in the pipeline can be coupled to output pins of the device. Device pins that are used in normal operating mode to output the most significant bits of the ADC output are used in calibration mode to make available output bits of a pipeline stage being calibrated. A calibration method takes advantage of the outputs of the stages being directly observable to compute calibration values. The output bits of a pipeline stage are monitored as the analog input to the ADC is increased. A change in these bits identifies a subrange boundary. Errors are measured for values immediately above and immediately below each subrange boundary and used to compute correction factors.

19 Claims, 6 Drawing Sheets

U.S. PATENT DOCUMENTS

| | | | |
|---|---|---|---|
| 6,472,897 B1 | 10/2002 | Shyr et al. | 324/765 |
| 6,486,806 B1 * | 11/2002 | Munoz et al. | 341/120 |
| 6,501,411 B1 | 12/2002 | Soundarapandian et al. | 341/161 |
| 6,563,445 B1 * | 5/2003 | Sabouri | 341/120 |
| 6,570,411 B1 | 5/2003 | Bardsley et al. | 327/94 |
| 6,570,523 B1 | 5/2003 | Bacrania et al. | 341/155 |
| 6,606,042 B1 * | 8/2003 | Sonkusale et al. | 341/120 |
| 6,621,434 B1 * | 9/2003 | Barry et al. | 341/141 |
| 6,633,249 B1 | 10/2003 | Whittaker et al. | 341/158 |
| 6,639,744 B1 | 10/2003 | Ohno | 341/161 |
| 6,642,871 B1 * | 11/2003 | Takeyabu et al. | 341/120 |
| 6,650,881 B1 * | 11/2003 | Dogan | 455/276.1 |
| 6,683,554 B1 | 1/2004 | Nikai et al. | 341/161 |
| 6,741,194 B1 * | 5/2004 | Cassagnes et al. | 341/118 |
| 6,822,601 B1 * | 11/2004 | Liu et al. | 341/161 |
| 6,836,230 B1 * | 12/2004 | Le Pailleur et al. | 341/141 |
| 6,861,969 B1 * | 3/2005 | Ali | 341/161 |
| 6,891,486 B1 * | 5/2005 | Pentakota et al. | 341/120 |
| 6,894,631 B1 * | 5/2005 | Bardsley | 341/120 |
| 6,975,950 B1 * | 12/2005 | Bardsley | 702/106 |
| 2004/0051657 A1 | 3/2004 | Jonsson et al. | |
| 2004/0070530 A1 | 4/2004 | You | |

OTHER PUBLICATIONS

Analog Devices, "IF Digitizing Subsystem," AD9874, 2003, pp. 1-40, no month.

Analog Devices, "12-Bit, 105 MSPS/125 MSPS IF Sampling A/D Converter," AD9433, 2001, pp. 1-24, no month.

Dallas Mazim Semiconductor, "INL/DNL Measurements for High-Speed Analog-to-Digital Converters (ADCs)," http://www.maxim-ic.com/appnotes.cfm?appnote_number=283, downloaded Jan. 27, 2004, pp. 1-8.

* cited by examiner

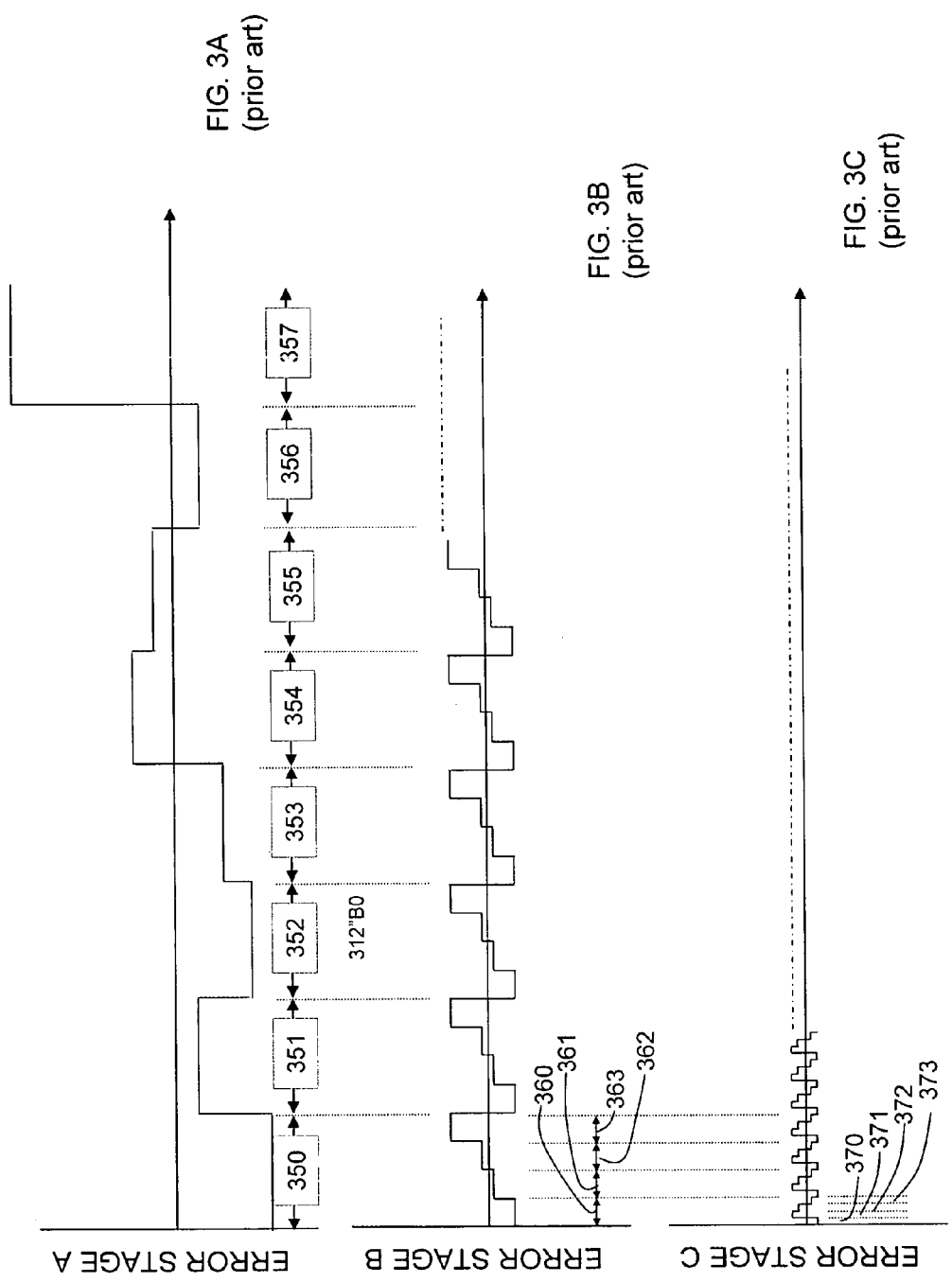

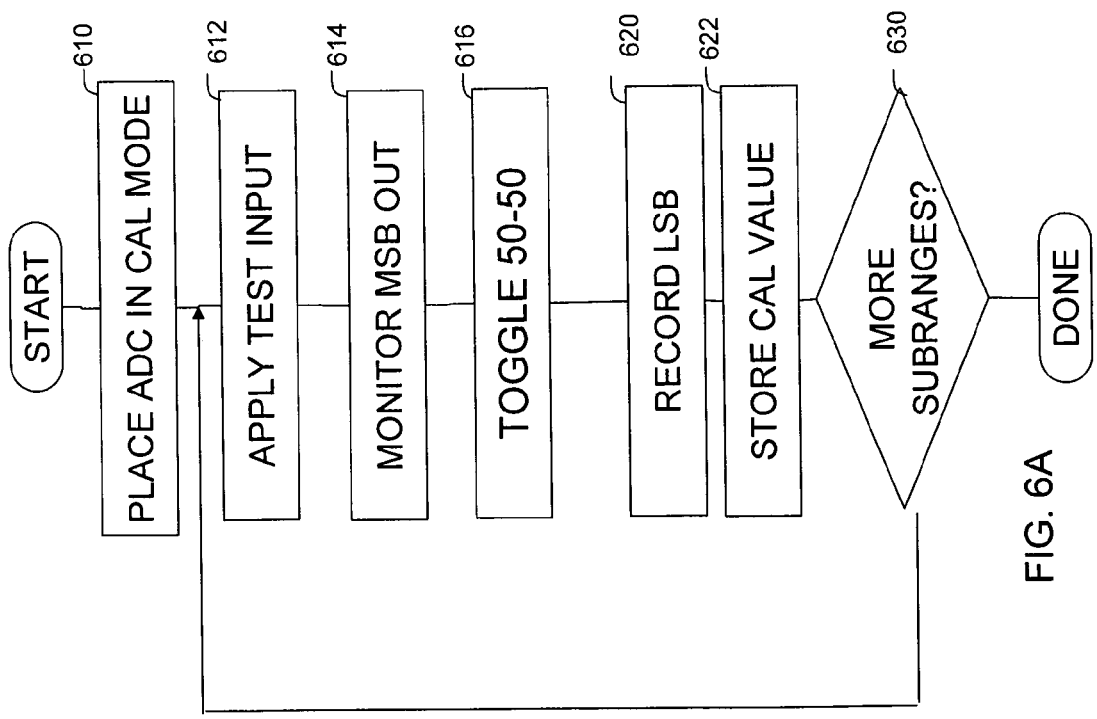

CALIBRATION OF ANALOG TO DIGITAL CONVERTER BY MEANS OF MULTIPLEXED STAGES

BACKGROUND OF INVENTION

1. Field of Invention

This invention relates generally to analog to digital converters and more specifically to calibration of analog to digital converters.

2. Discussion of Related Art

Analog to digital converters are used in many modern electronic systems. Many electrical signals are analog—meaning that the signal can take on any value in a range of values. However, many components in electronic systems operate on digital signals—meaning that the value of the signal is represented at any time by "bits" of data, with each bit taking on only one of two possible states. Accordingly, there is a need for analog to digital converters to allow analog signals to be processed in digital form.

FIG. 1 shows in simplified block diagram form a prior art analog to digital converter. Analog to digital converter (ADC) 100 receives an analog input $S_{in}$ and produces a digital output 120.

Analog input $S_{in}$ is applied to a buffer amplifier 112. The output of buffer amplifier 112 is applied to a chain of separate stages 114A, 114B . . . 114N. Usually, these stages are pipelined.

Each of the stages 114A, 114B . . . 114N receives an analog input and produces a digital output. The digital outputs of the stages are applied to digital logic 116. Each stage also produces an analog output that is passed on to the next stage. The analog output of the stage is a residue, representing the difference between the analog input of the stage and the value corresponding to the digital output of that stage. Because each stage represents its input with a finite number of digital bits, the digital representation produced at each of the stages is not an exact representation of the value of the analog input. However, at each stage the residue becomes smaller, meaning that the collective outputs of all of the stages becomes a more accurate representation of the analog input $S_{in}$ as outputs of more stages are produced.

Digital logic 116 combines the outputs of all of the stages 114A, 114B . . . 114N into a binary output 118. In general, it is not necessary that there be a one-to-one correspondence between the output bits of the stages and the bits of the digital word 118. For example, stage 114A might produce digital outputs that could take on one of six possible states. Stage 114B might have digital output bits that represent one of three possible states. The combination of the output bits from the first two stages form the four most significant bits of the digital word 118. The output of stage 114B would also influence the output of the fifth most significant bit. Digital logic 116 is constructed to make the appropriate combination of bits from all of the stages 114A . . . 114N to produce a digital word 118. In this way, the digital output 120 of ADC 100 represents the analog input $S_{in}$.

Even though each stage has a limited number of bits and cannot exactly represent the input, it is desirable for each stage to output a digital value that is as close as possible to the value of the analog input to that stage. However, variations in manufacturing processes and other real-world phenomena often preclude the construction of stages that always respond as desired. In practice, calibration circuitry is included in an ADC. Measurements are made on an ADC to detect differences between the actual and expected performance. The calibration circuitry is set to counteract differences between actual and desired performance of the ADC.

ADC 100 is shown to include calibration circuitry in the form of calibration memories 130A, 130B, 130C . . . 130N. These calibration memories hold values that map the output values produced by each of the stages as nearly as possible to the desired values.

As part of the manufacture of ADC 100, a calibration process is used to determine calibration values for memories 130A . . . 130N. A series of test inputs is applied to ADC 100 and the output of the converter observed. Differences between the actual digital output of the analog to digital converter and the expected output based on the value of the analog input can be measured. The measurement of the difference can be used to compute calibration values. These calibration values are stored in memories 130A . . . 130N.

However, it is difficult to determine what calibration values to store in the memories. Because there is not a one-to-one relationship between the output digital bits and the output of the individual stages, it is difficult to identify the values of outputs of stages 114A . . . 114N from the digital word observable at the output 120 of ADC 100. For this reason, prior art ADC's have been limited in the number of stages having calibration memories. Generally, only the first stage or two included such a memory.

FIG. 2A shows a transfer function of an idealized ADC. Line 210 shows that as the analog input increases, the digital output increases. Line 210 depicts a series of steps. These steps result from the fact that the ADC can represent only a finite number of values. The idealized ADC produces an output that matches the input value to the closest one of these finite values. As the analog input increases and comes closer to the next higher value that can be represented, the digital output steps up. These steps are evenly centered around line 200, showing the linear relationship between the input and the output.

FIG. 2B shows the same type of plot for a realistic, or non-idealized, ADC. As in FIG. 2A, the output values increase in steps. Unlike FIG. 2A, each step in FIG. 2B is not centered around line 200. For each output value, the difference between the actual position of the step and the idealized position as shown in FIG. 2A represents non-linearity in the conversion process. To make a more accurate analog to digital converter it is desirable to remove this nonlinearity. Values stored in calibration memories 130A . . . 130N should adjust for any nonlinearity.

FIGS. 3A–3C illustrate that the nonlinearity error is the result of error components from each of the stages 114A, 114B . . . 114N. FIG. 3A illustrates the linearity error of stage 114A. FIG. 3A is divided into subranges 350, 351 . . . 357. Each of the subranges corresponds to an output value of the stage. The term "subrange" is used because each stage should have a certain value for a range of analog inputs. Accordingly, the ordinate of the graph might be thought of as a range of analog inputs or the specific digital values corresponding to those inputs. The linearity error of stage 114A may be different in each of the subranges.

FIG. 3B shows linearity error associated with stage 114B. Stage 114B has subranges 360, 361, 362, 363. The output of stage 114B may take on multiple values in each subrange defined for stage 114A. For this reason, the subranges for stage 114B are smaller than the subranges for stage 114A. Also, the error pattern for stage 114B repeats in each of the subranges for stage 114A.

FIG. 3C shows this pattern continuing for stage 114C. Stage 114C also introduces linearity errors. The amount of error is different in each of the subranges for stage 114C. Each of the subranges 370, 371, 372 and 373 for stage 114C is smaller than the subranges in stage 114B. The pattern of error repeats in each of the subranges 360, 361, 362 and 363 for stage 114B.

This pattern repeats for all stages, with the subrange per stage getting smaller at each successive stage. An ADC will be most accurate if correction factors can be ascertained and stored in calibration memories for each stage. In practice, it is difficult to determine these values for stages 114B and successive stages. Also, the errors get smaller for successive stages. Thus, despite the fact that FIG. 1 has been generalized to show calibration memories for all stages 114A . . . 114N, such memories have traditionally been used for only the first stage.

Part of the difficulty in ascertaining the correction factors is that the errors from each of the stages are superimposed to create a combined error at the output 120 of the ADC 100. The total nonlinearity error of ADC 100 can be determined, for example, by applying an analog input in the form of a ramp 200. The actual output of ADC 100 will contain non-uniform steps as shown in FIG. 2B. The non-linearity error can be measured by comparing the input voltages at which transitions occur to the values at which such transitions should have occurred with idealized performance as shown in FIG. 2A. However, it is difficult to determine from just the output what error was contributed by each stage.

Also, noise on the analog signal causes the performance of ADC 100 to differ from the idealized form shown in FIG. 2A. Noise is particularly a problem for detecting small errors introduced at stages 114B and smaller stages.

Further, there is not a one-to-one correspondence between the output of each of the stages 114A, 114B . . . 114N and the digital output bits of work 118. Accordingly, when measuring the overall error in analog to digital converter 100 it is often not readily apparent which correction factors need to be loaded into correction memories 130A, 130B . . . 130N.

FIG. 4 represents a plot of non-linearity errors as might be measured for an analog to digital converter. The non-linearity errors shown in FIG. 4 represent the combination of the errors introduced by all of the stages, such as those shown in FIGS. 3A, 3B, and 3C. The plot also reflects noise on the analog signals. FIG. 4 is sometimes called an Integrated Non-Linearity (INL) plot.

Though the errors introduced by all of the stages are blended together in the INL plot of FIG. 4, knowing that the magnitude and repetition rate of errors introduced by each stage follows a pattern as shown generally in FIGS. 3A . . . 3C, might allow identification of the errors produced at each stage. For example, subrange 420 can be identified by a relatively large change in the INL plot such as represented by transitions 412 and 414. The average value of the error in subrange 420 between these transactions might be correlated to one of the subranges 350, 351 . . . 357 shown in FIG. 3A. This approach has been used with some prior art analog to digital converters to identify correction factors for the first stage of a pipelined analog to digital converter. However, for subsequent stages it becomes more and more difficult to identify the component of the overall error contributed by each stage.

One technique that has been used to determine calibration values for higher number stages involved the addition of special hardware to the ADC. This hardware overrides the portion of each stage that outputs the digital bits for that stage. During a test, the input to the ADC is increased until a change in the digital output indicates that a subrange boundary has been crossed. Once the input voltage corresponding to a transition between subranges is determined, the input voltage to the ADC is held constant at that value. The specific stage of the ADC that has changed its output to create the subrange boundary is identified. The digital outputs of that stage are forced to toggle between the value below the subrange boundary and the value above the subrange boundary.

As the output of the stage toggles between subranges, a tester measures the output of the ADC. Measurements taken while the stage is forced to have a value representing the subrange below the boundary represent the error at the upper end of that subrange. Measurements taken while the stage is forced to have a value above the boundary represent error at the lower end of that subrange. By making similar measurements at each subrange boundary, the nonlinearity error in each subrange can be computed and appropriate correction factors to counter this error can be determined.

This approach requires that subrange boundaries be detected by observing the output of the ADC, which can be difficult. It would be desirable to provide a way to calibrate an ADC that does not rely on detecting subrange transitions from the output of the ADC. It would be desirable to accurately determine calibration factors, without requiring additional circuitry in an analog to digital converter to force certain stages into desired output ranges.

SUMMARY OF INVENTION

The invention relates to improving the calibration of an analog to digital converter.

In one aspect, the invention relates to an integrated circuit having a plurality of external output points. The integrated circuit includes an analog to digital converter with a plurality of stages, each stage having a digital output with a plurality of bits and digital logic coupled to the digital outputs of each of the plurality of stages and having a digital output word with a plurality of digital bits representing a combination of the digital outputs of the plurality of stages. The integrated circuit also has switching circuitry with at least one first input coupled to at least one of the digital outputs of at least one of the plurality of stages; at least one second input coupled to at least a portion of the digital bits in the digital output word; an output coupled to at least a portion of the plurality of external output points; a control input; and control circuitry that selectively couples one of the at least one first inputs or one of the at least one second inputs to the output in response to the control input. In a preferred embodiment, such an integrated circuit will include calibration memories.

In another aspect, the invention relates to a method of calibrating an analog to digital converter having an analog input and a plurality of stages, each stage having a digital output with a plurality of bits with the digital outputs of the plurality of stages being coupled to logic that forms a digital output word having a plurality of bits. The method involves configuring the analog to digital converter so that the digital output of at least one of the stages and at least a portion of the plurality of bits of the digital output word are observable external to the analog to digital converter. A test signal to apply to the analog input is determined from observation of the digital output of the at least one of the stages external to the analog to digital converter. The test signal is applied and the portion of the plurality of bits of the digital output word is observed. A calibration value is determined from the observed portion of the plurality of bits of the digital output word.

Such a method is, in a preferred embodiment, employed with an analog to digital converter implemented as an integrated circuit contained within a package having a plurality of leads accessible from the exterior of the package with a portion of the leads connected in a normal operating mode to the digital output word.

In yet a further aspect, the invention relates to a method of manufacturing an analog to digital converter having an analog input and a plurality of stages, each stage having a digital output with a plurality of bits with the outputs of the plurality of stages being combined into a digital output word having a plurality of bits. The analog to digital converter is configured so that the digital output of at least one of the stages and at least a portion of the plurality of bits of the digital output word are observable external to the analog to digital converter. A test signal to apply to the analog input is determined from observation of the digital output of the at least one of the stages external to the analog to digital converter. That test signal is applied and the portion of the plurality of bits of the digital output word is observed. A calibration value is determined from the observed portion of the plurality of bits of the digital output word. The calibration value is stored in the analog to digital converter.

In one embodiment, the method involves configuring the analog to digital converter so that the digital output of at least one of the stages and at least a portion of the plurality of bits of the digital output word are observable external to the analog to digital converter comprises making only the least significant bits of the digital output word observable external to the analog to digital converter.

In a further embodiment, the analog to digital converter is an integrated circuit contained within a package having a plurality of leads accessible from the exterior of the package with a portion of the leads connected in a normal operating mode to the digital output word.

In a further embodiment, the analog to digital converter is configured by connecting both the digital output of at least one of the stages and a portion of the plurality of bits of the digital output word to the portion of the leads connected in a normal operating mode to the digital output word.

In yet a further embodiment, a test signal to apply to the input is determined by changing the level of the test signal until a change in the value of the observable output of at least one of the stages changes.

In yet a further embodiment, the test signal oscillates about the level of the test signal when the observable output of at lest one of the stages changed values.

In yet a further embodiment, a calibration value is determined by associating values of the portion of the plurality of bits with error at the upper or lower end of a subrange of a stage of the analog to digital converter and using the errors at the upper and lower end of each subrange to computer a corrected value for each subrange of the stage.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIGS. 3A, 3B, and 3C are sketches illustrating non-linearity errors introduced by different stages of a pipelined analog to digital converter;

FIG. 6A is a flowchart of a process for calibrating an analog to digital converter shown in FIG. 5; and FIG. 6B is a sketch useful in understanding a step in the process of FIG. 6A.

DETAILED DESCRIPTION

Figure 1:
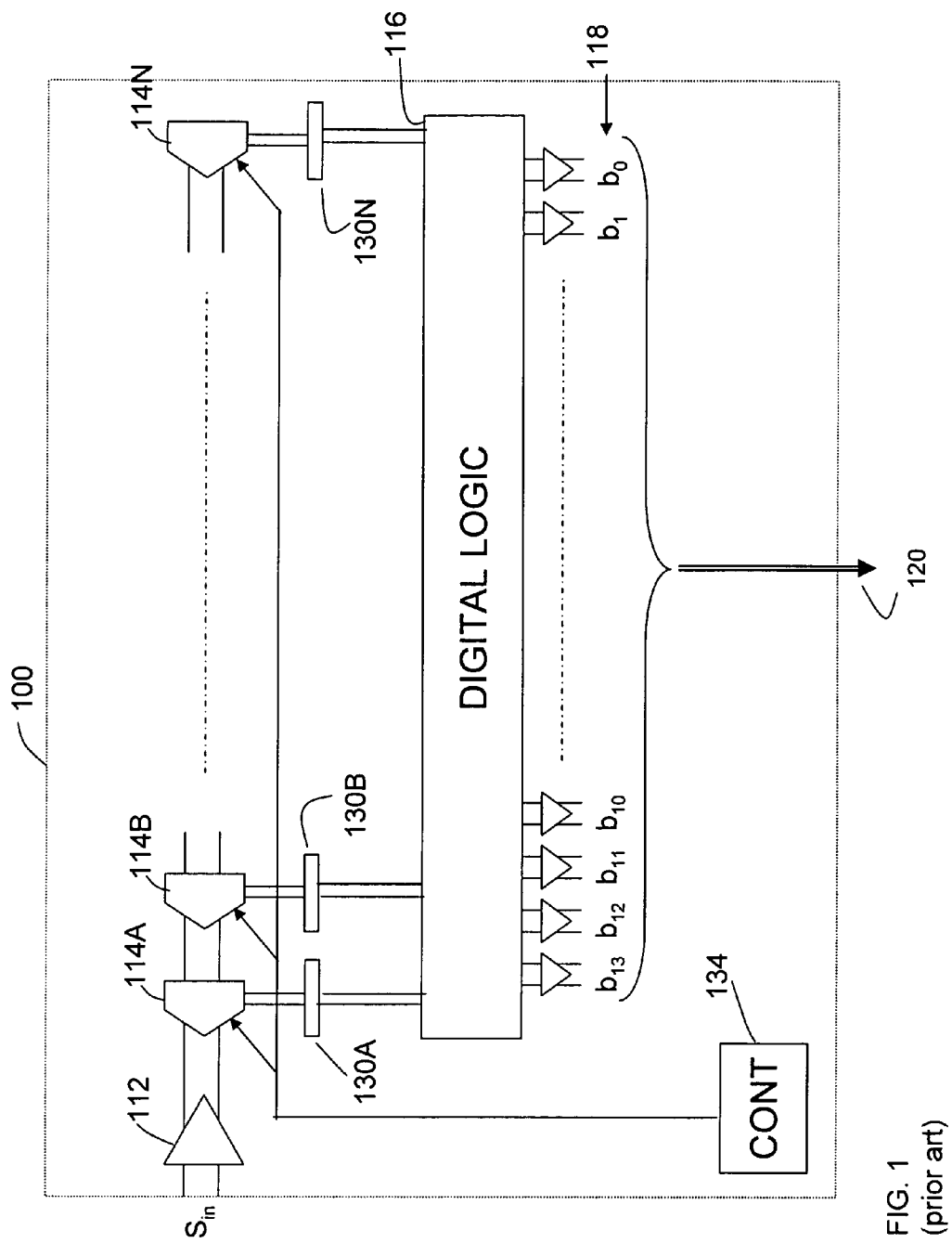
FIG. 1 is a block diagram of a prior art analog to digital converter.
Figures 2A, 2B:
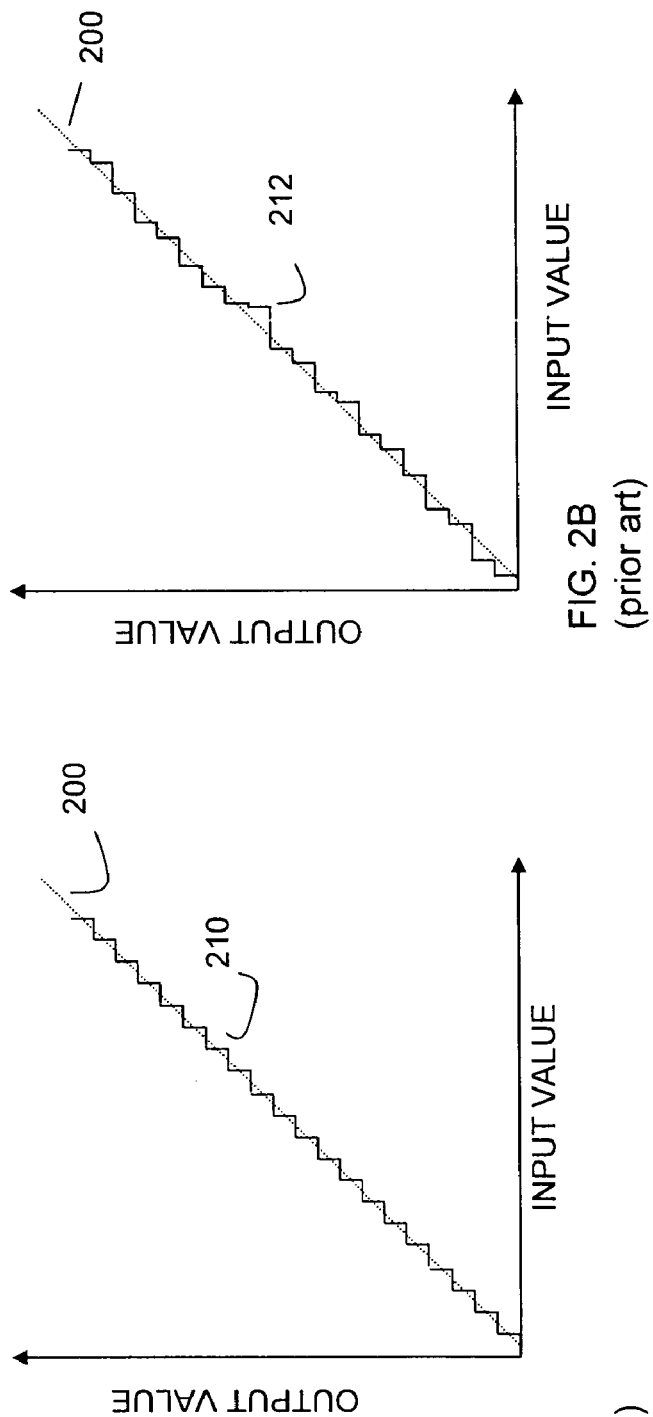
FIG. 2A is a sketch indicating the transfer function of an idealized analog to digital converter.
FIG. 2B is a sketch illustrating the transfer function of an actual analog to digital converter.
Figure 4:
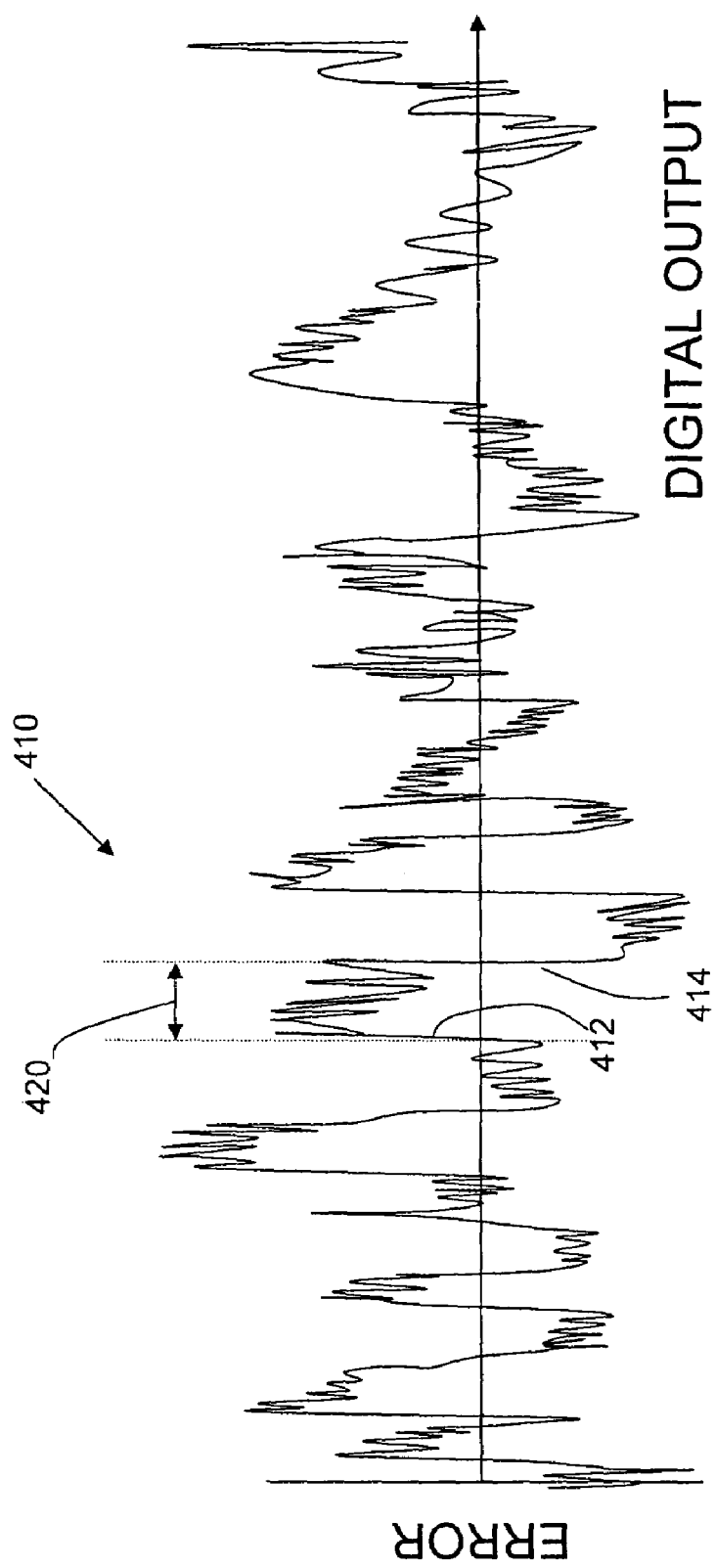
FIG. 4 is a sketch illustrating the integrated non-linearity error of a practical analog to digital converter.

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing" "involving" and variations thereof herein, is meant to encompass the items listed thereafter and equivalents thereof as well as additional items.

Figure 5:
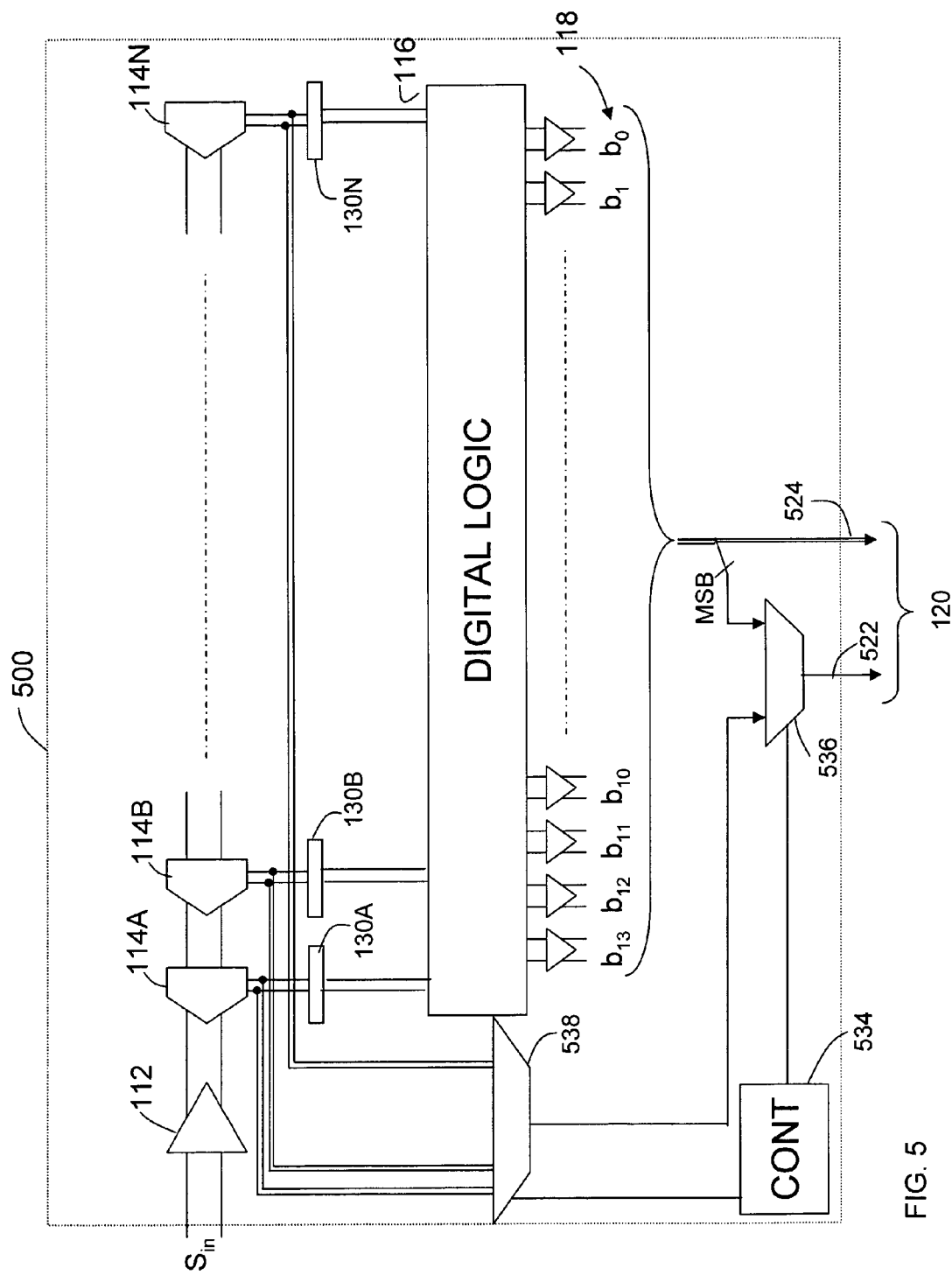
FIG. 5 is a block diagram of an analog to digital converter incorporating the invention.

FIG. 5 shows an ADC 500 that includes calibration features. As with the prior art, ADC 500 includes a series of pipeline stages 114A, 114B . . . 114N. The outputs of these stages are coupled to digital logic 116. Digital logic 116 combines the output bits of each of the stages into an output digital word 118.

ADC 500 includes calibration memories 130A, 130B . . . 130N. As with the prior art, calibration of the higher order stages in the pipeline has only a small impact on the overall non-linearity of ADC 500. The calibration memories associated with the higher order stages might therefore be omitted or not used. However, ADC 500 preferably has at least the calibration memory 130A and 130B associated with the first two stages 114A and 114B in the pipeline.

The output digital word 120 of ADC 500 is divided into portions 522 and 524. Portion 522 contains at least as many bits as there are bits in the output of any of the stages that are to be calibrated. In the preferred embodiment, output digital word has 14 bits in total, and portion 522 contains six bits.

Portion 524 is coupled to the least significant bits output by digital logic 116. Portion 522 is derived from multiplexer 536. Multiplexer 536 allows portion 522 to be coupled to the most significant bits out of digital logic 116, here bits $b_{13} \ldots b_8$. Alternatively, multiplexer 536 allows portion 522 to be coupled to the output bits of any of the stages 114A, 114B . . . 114N.

The second input of multiplexer 536 is coupled to multiplexer 538. An input to multiplexer 538 is preferably coupled to the output bits of every stage that might be calibrated for non-linearity errors. Control circuit 534 generates the control signals to both multiplexers 536 and 538 to couple the appropriate output bits for each stage to portion 522 of the output digital word 120.

Multiplexers 536 and 538, by coupling outputs of selected stages to the outputs of ADC 500, allows a direct observation of a transition from one subrange to the next as the input analog signal $S_{in}$ is increased. FIG. 6A shows the manner in which this circuitry can be used to efficiently calibrate ADC 500 for non-linearity errors.

FIG. 6A shows the calibration process starts at step 610 where ADC 500 is placed in calibration mode. In a contemplated embodiment, ADC 500 will be calibrated through the use of an external tester (not shown). The tester will be able to generate a controlled analog signal used as an input attached to $S_{in}$. The tester will be able to read the output digital word 120, including both portions 522 and 524. The tester will be programmed to place ADC 500 in calibration mode. In a contemplated embodiment, ADC 500 will be placed in calibration mode when the external tester writes a control code to a control register (not shown). However, other ways are known in the art for changing the operating mode of an analog to digital converter.

When configuring ADC 500 to perform a test, multiplexer 536 is switched such that the output of multiplexer 538 is passed through to portion 522 of the output of ADC 500. Multiplexer 538 is configured to pass through the output bits of a selected stage. Preferably the stages will be calibrated sequentially starting with stage 114A. Preferably, at least stages 114A and 144B will be calibrated. Higher order stages may also be calibrated.

At step 612, the external tester (not shown) applies a test input. FIG. 6B provides an example of an appropriate test signal input. During step 612, the test input takes on shape 662. Shape 662 is generally increasing. In the example of FIG. 6, the shape 662 is a monotonically increasing signal, such as on ramp.

At step 614, the external tester monitors the most significant bits out of ADC 500. The most significant bits out of ADC 500 are portion 522. With ADC 500 configured for a test mode, the monitored bits represent the output of the stage being calibrated. When the value of the MSB being monitored changes, the test equipment can directly ascertain that a boundry between subranges has been crossed.

When a change in the most significant bits is detected, the process proceeds to step 616. At step 616, the form of the test input is changed. The test input takes on the shape shown in region 664 of FIG. 6B. The test input oscillates with very slight oscillations. The center point of the oscillations is selected to ensure that the most significant bits are toggling about the value that indicates the desired subrange has been crossed. Preferably, approximately 50% of the time the most significant bits will have a value below the subrange boundary and 50% of the time a value above the subrange boundary.

At step 620, the tester records the least significant bits out of ADC 500. These values represent the least significant bits of the digital value produced by digital logic 116. Because ADC 500 is toggling between two subranges, some of the values represent the least significant bits of the output 120 when the analog input is at the high end of the subrange below the boundary. Others represent the least significant bits of output 120 when the analog input is at the low end of the subrange above the boundary. Portion 522 indicates with which subrange each value is associated. In addition to recording the value of the LSB, the subrange of ADC 500 with which these LSBs are associated is also stored.

An indication of the error at the low end and high end of each subrange can be determined by comparing the digital outputs of ADC 500, as reflected in portion 524, to the analog input signal. This comparison can be made even though only the least significant bits of the digital output 118 are available at portion 524. The correction factor for any subrange is determined by comparing the error at the high end and the low end of the subrange. Computing the error without using the most significant bits of digital output 118 results in the error computation at each end of the subrange being offset by an amount equal to the value of the most significant bits not made available at output 120. However, the change in the value of the digital output 118 across a subrange should be so small that the most significant bits of digital word 118 can be treated as a constant value. When errors at two ends of a subrange are compared, the most significant bits of digital output 118 act as a constant offset on both values and the results of the comparison are not affected by the value in the most significant bits of digital output 118. Therefore, not having available the most significant bits of digital word 118 does not affect the comparison. Recognition of this fact has allowed ADC 500 to be constructed in a way that it can readily provide calibration information in a calibration mode without requiring additional output leads of a package containing ADC 500.

At step 622, the correction factor for the subrange is computed. This value is then stored in the appropriate location in the calibration memory 130A . . . 130N. In a preferred embodiment, the value stored in the calibration memory is the corrected value of the bits for a subrange. The output bits from each stage 114A . . . 114N provide an address to the calibration memory that indexes the appropriate corrected value. However, any convenient way to store calibration values might be used. For example, the memory might store correction factors that are added to the digital bits produced by the stage.

Once the calibration value is stored for one subrange, processing proceeds to step 630. At step 630, a check is made whether there are more subranges for the stage being calibrated. If more subranges are to be calibrated, processing loops back to step 612. At step 612, the analog test input is increased as shown generally at 672 in FIG. 6B. While the input is being increased, the tester (not shown) monitors the bits in portion 522. When a change in the value of the bits in portion 522 is detected, processing proceeds to step 616. Again, the analog input is placed in a mode that causes the output bits of the stage being calibrated to toggle around the subrange boundary. An example of a suitable waveform is shown as region 676 of FIG. 6B.

The process is repeated iteratively until a calibration value is stored for each subrange of the stage under calibration. If further stages in ADC 500 need calibration, the entire process can be repeated. For each stage to be calibrated, the multiplexer 538 is switched to connect the digital outputs of the stage being calibrated through to multiplexer 536.

Having thus described several aspects of at least one embodiment of this invention, it is to be appreciated various alterations, modifications, and improvements will readily occur to those skilled in the art.

For example, FIG. 6A shows calibration values computed and stored for each subrange in a stage before measurements are taken for the next subrange. This order is not considered a limitation on the invention. For example, all calibration values might be stored in the calibration memories at one time. Such alterations, modifications, and improvements are intended to be part of this disclosure, and are intended to be within the spirit and scope of the invention. Accordingly, the foregoing description and drawings are by way of example only.

What is claimed is:

1. An integrated circuit having a plurality of external output points, comprising:
 a) an analog to digital converter, comprising:
  i) a plurality of stages, each stage having a digital output with a plurality of bits;
  ii) digital logic coupled to the digital outputs of each of the plurality of stages, the digital logic having a digital output word with a plurality of digital bits representing a combination of the digital outputs of the plurality of stages; and b) switching circuitry, comprising:
   i) at least one first input coupled to at least one of the digital outputs of at least one of the plurality of stages;
   ii) at least one second input coupled to at least a portion of the digital bits in the digital output word; and
   iii) an output coupled to at least a portion of the plurality of external output points;
   iv) a control input; and
   v) control circuitry that selectively couples the at least one first input or the at least one second input to the output in response to the control input.

2. The integrated circuit of claim 1 additionally comprising a plurality of calibration memories, wherein the digital logic is coupled to the digital outputs of each of at least a portion of the plurality of stages through a calibration memory of the plurality of calibration memories.

3. The integrated circuit of claim 2 wherein the calibration memory has an input and an output, and the calibration memory provides at its output a calibrated value in response to the value at its input.

4. The integrated circuit of claim 2 wherein the analog to digital converter comprises at least three stages and at least two calibration memories.

5. The integrated circuit of claim 1 wherein the switching circuitry comprises a first multiplexer having a first input coupled to the most significant bits of the output digital word and an output coupled to a portion of the external output points.

6. The integrated circuit of claim 5 additionally comprising a second multiplexer having a plurality of inputs, each coupled to the digital outputs of one of the plurality of stages, and an output coupled to the second input of the first multiplexer.

7. The integrated circuit of claim 1 wherein the digital output word consists of 14 bits.

8. An analog to digital converter comprising:
an analog input;
a digital output having a plurality of bits;
logic that forms a digital output word having a plurality of bits representing a value of the analog input, the digital output word being coupled to the digital output;
a plurality of stages, each stage having a digital output with at least one bit, with the digital outputs of the plurality of stages being coupled to the logic; and
circuitry for selectively replacing at least a portion of the plurality of bits of the digital output word at the digital output of the analog to digital converter with the digital output of at least one of the stages.

9. The analog to digital converter of claim 8 packaged as an integrated circuit having a plurality of leads accessible from the exterior of the package with a portion of the leads forming the digital output being coupled in a normal operating mode to the digital output word.

10. The analog to digital converter of claim 9 wherein the circuitry for selectively replacing comprises circuitry coupling both the digital output of at least one of the stages and a portion of the plurality of bits of the digital output word to the portion of the leads.

11. The analog to digital converter of claim 8 wherein the circuitry for selectively replacing routes only the least significant bits of the digital output word to the digital output.

12. The analog to digital converter of claim 8 additionally comprising a calibration memory coupled between each of the at least one of the stages.

13. An analog to digital converter having a plurality of external output points, the analog to digital converter comprising:
a) a plurality of stages, each stage having a digital output with a plurality of bits;
b) digital logic coupled to the digital outputs of each of the plurality of stages and having a digital output word with a plurality of digital bits representing a combination of the digital outputs of the plurality of stages; and
c) switching circuitry, comprising:
   i) at least one first input coupled to at least one of the digital outputs of at least one of the plurality of stages;
   ii) at least one second input coupled to at least a portion of the digital bits in the digital output word; and
   iii) an output having a plurality of bits each coupled to one of the plurality of external output points, the plurality of bits having values selectively derived from the at least one first input and the at least one second input.

14. The analog to digital converter of claim 13 additionally comprising a plurality of calibration memories, wherein the digital logic is coupled to the digital outputs of the at least one of the plurality of stages through one of the plurality of calibration memories.

15. The analog to digital converter of claim 14 wherein each of the plurality of the calibration memories has an input and an output, and the calibration memory provides at its output a calibrated value in response to the value at its input.

16. The analog to digital converter of claim 14 wherein the analog to digital converter comprises at least three stages and at least two calibration memories.

17. The analog to digital converter of claim 13 wherein the switching circuitry comprises a first multiplexer having a first input coupled to the most significant bits of the output digital word and an output coupled to a portion of the external output points.

18. The analog to digital converter of claim 17 additionally comprising a second multiplexer having a plurality of inputs, each coupled to the digital outputs of one of the plurality of stages, and an output coupled to the second input of the first multiplexer.

19. The analog to digital converter of claim 13, wherein the digital output word consists of 14 bits.

* * * * *